United States Patent [19]
Moriga

[11] Patent Number: 5,323,058
[45] Date of Patent: Jun. 21, 1994

[54] SEMICONDUCTOR DEVICE INCLUDING PACKAGE WITH IMPROVED BASE-TO-COP SEAL

[75] Inventor: Namiki Moriga, Itami, Japan

[73] Assignee: Mitsubishi Denki Kabushiki Kaisha, Tokyo, Japan

[21] Appl. No.: 15,236

[22] Filed: Feb. 9, 1993

[30] Foreign Application Priority Data

Feb. 12, 1992 [JP] Japan .................. 4-025252

[51] Int. Cl.$^5$ ............... H01L 23/02; H01L 23/12
[52] U.S. Cl. .................. 257/704; 257/710; 257/666
[58] Field of Search ............ 257/704, 700, 710, 729, 257/730, 666

[56] References Cited

U.S. PATENT DOCUMENTS 4,575,748 3/1986 Terui et al. .................. 257/666

FOREIGN PATENT DOCUMENTS

| | | |
|---|---|---|
| 58-127474 | 7/1983 | Japan .................. 257/704 |
| 58-176979 | 10/1983 | Japan .................. 257/704 |
| 61-4251 | 1/1986 | Japan .................. 257/74 |
| 61-69152 | 4/1986 | Japan .................. 257/704 |
| 1-57738 | 3/1989 | Japan .................. 257/704 |
| 2-66961 | 3/1990 | Japan .................. 257/704 |
| 2-260648 | 10/1990 | Japan .................. 257/704 |
| 3-194952 | 8/1991 | Japan .................. 257/704 |

Primary Examiner—Rolf Hille
Assistant Examiner—S. V. Clark
Attorney, Agent, or Firm—Leydig Voit & Mayer

[57] ABSTRACT

A semiconductor device includes: a base and a cap having sealing surfaces furnished with a structure to prevent outflow of resin on the inner side of each corner thereof; and a lead frame arranged between the sealing surfaces of the base and the cap, with a part of the lead frame extending into each corner of the sealing surfaces, whereby the generation of recesses and holes in the resin sealing portion is prevented and a high-quality semiconductor device can be obtained which provides a satisfactory production yield.

5 Claims, 16 Drawing Sheets

FIG. 20A    FIG. 20B
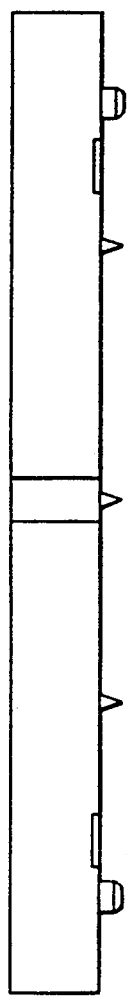
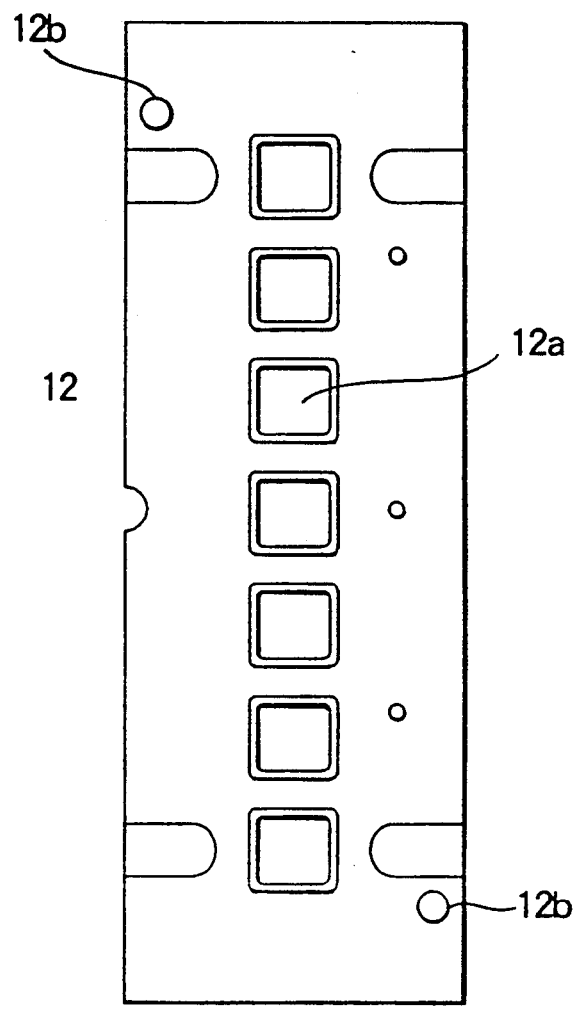
FIG. 20C
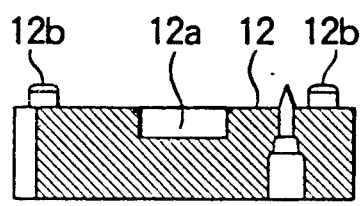

SEMICONDUCTOR DEVICE INCLUDING PACKAGE WITH IMPROVED BASE-TO-COP SEAL

BACKGROUND OF THE INVENTION

1. Field of the Invention

This invention relates to a semiconductor device and, in particular, to a semiconductor structure enclosing a semiconductor chip within a resin sealed base and cap which are joined together with an improved seal.

2. Description of the Related Art

FIG. 15 is a sectional view showing a conventional resin sealed semiconductor device, for example, a pressure sensor. Referring to the drawing, a die pad 2 is fixed to a base 1 by an adhesive 3, and a semiconductor element 4 is fixed to a pedestal 4a that is mounted with an adhesive 5 on the die pad. A cap 6 is joined to the base 1 with sealing resin 7. Leads 8, which extend through the interface between the base 1 and the cap 6, are electrically connected to the semiconductor element 4 through metal wires 9. The dimensions of sealing surfaces 1a and 6a of the base 1 and the cap 6 are determined as shown in FIGS. 16A, 16B, 17A and 17B. The values given in these drawings are in millimeters.

Next, a process of producing the conventional semiconductor device, constructed as described above, will be explained in detail.

First, the resin 7 is applied to the sealing surfaces 1a and 6a using resin application masks 10 and 11 as shown in FIGS. 18 and 19, respectively. The resin application masks 10 and 11 allow simultaneous application of the resin 7 to a plurality of bases 1 and caps 6, which, after the resin 7 has been applied to the sealing surfaces 1a and 6a thereof, are respectively attached to attachment sections 12a and 13a of sealing jigs 12 and 13 shown in FIGS. 20A to 20C and FIGS. 21A and 21B.

In this condition, a continuous lead frame with the semiconductor elements 4 mounted thereon is placed on the base 1, and the sealing jig 12 having the caps 6 is reversed so that the sealing surfaces 6a of the caps 6 face the sealing surfaces 1a of the bases 1. The sealing jigs 12 and 13 are made to abut each other in a position where pins 12b of the jig 12 are mated with pin holes 13b of the jig 13, and the bases 1 and the caps 6 are joined to each other by means of the resin due to the engagement of the pins 12b with the pin holes 13b.

In this process, the jigs 12 and 13 are heated to a temperature of approximately 150° C. When the bases 1 and the caps 6 are respectively attached to the jigs 12 and 13, the heat of the jigs 12 and 13 is conducted in approximately five seconds to the bases 1 and the caps 6, and the viscosity of the resin 7 applied to the sealing surfaces 1a and 6a first decreases rapidly as shown in FIG. 22, and then increases rapidly so that the resin is cured in approximately ten minutes. When the resin 7 has thus been cured, the joining of the bases 1 with the caps 6 is complete, and the jigs 12 and 13 are disassembled, thus completing the semiconductor devices.

In the conventional semiconductor device, produced by the above production process, the resin 7 applied through the resin application mask 10 is a fluid and, in consequence, an outflow of resin is liable to occur, in particular, on the inner side of each corner of the sealing surfaces 1a and 6a, resulting in a shortage of resin for joining the base 1 with the cap 6. Further, at the point in time when the viscosity of the resin 7 rapidly decreases as shown in FIG. 22, the amount of resin 7 flowing out further increases, thereby causing the shortage of the resin to become even greater. In addition, the leads 8 extend through the seal, from the inside to the outside thereof, perpendicularly to each side of the sealing surface 1a, as shown in FIG. 23, which leads to another problem. As shown in FIG. 24, in the middle sections of the sealing surface where the leads extend through the seal, the resin 7 moves toward the leads 8 due to surface tension, with the result that there is a shortage of resin in the corner sections of the device, where there are no leads 8. This is particularly true in the case where, due to the limitation on external dimensions of the device as a result of the progress made in device miniaturization, the inner diameters of the base 1 and the cap 6 must be made as large as possible and equalized to ensure that the requisite accommodating space is provided.

A shortage of resin for joining the base 1 with the cap 6, due to the above-described reason, causes recesses and holes in the seal after joining the base 1 with the cap 6. This causes the sealing to be incomplete, resulting in a degeneration in device quality, a reduction in production yield, etc.

SUMMARY OF THE INVENTION

This invention has been made with a view toward solving the above problems. It is accordingly an object of this invention to provide a high-quality semiconductor device which provides a satisfactory production yield by preventing the formation of recesses and holes in the resin seal.

In order to achieve the above object, according to one aspect of this invention, there is provided a semiconductor device comprising:

a semiconductor chip;

a base and a cap enclosing the semiconductor chip and which have substantially the same inner diameters;

a resin gluing a sealing surface of the base and a sealing surface of the cap to each other;

a lead frame placed between the sealing surfaces of the base and the cap;

electrical connection means for electrically connecting the semiconductor chip to the lead frame; and means for preventing outflow of resin disposed on the inner side of each corner of the sealing surface of the base.

In a second aspect of this invention, there is provided a semiconductor device comprising:

a semiconductor chip;

a base and a cap enclosing the semiconductor chip;

a resin gluing a sealing surface of the base and a sealing surface of the cap to each other;

a lead frame placed between the sealing surfaces of the base and the cap; and electrical connection means electrically connecting the semiconductor chip to the lead frame, wherein the inner diameter of the sealing surface of the base is smaller than the inner diameter of the sealing surface of the cap and the outer diameter of the sealing surface of the base is substantially the same as the outer diameter of the sealing surface of the cap.

In a third aspect of this invention, there is provided a semiconductor device comprising:

a semiconductor chip;

a base and a cap enclosing the semiconductor chip and which have substantially the same inner diameters;

a resin gluing sealing surfaces of the base and the cap to each other;

a lead frame placed between the sealing surfaces of the base and the cap; and electrical connection means electrically connecting the semiconductor chip to the lead frame, wherein the lead frame extends into corners of the sealing surfaces of the base and the cap.

In a fourth aspect of this invention, there is provided a semiconductor device comprising:

a semiconductor chip;

a base and a cap enclosing the semiconductor chip and which have substantially the same inner diameters;

a resin gluing a sealing surface of the base and a sealing surface of the cap to each other;

a lead frame placed between the sealing surfaces of the base and the cap; and electrical connection means electrically connecting the semiconductor chip to the lead frame, wherein the resin is disposed on the sealing surface of the base or that of the cap in a width smaller than that of the sealing surfaces of the base and the cap.

In a fifth aspect of this invention, there is provided a semiconductor device comprising:

a semiconductor chip;

a base and a cap enclosing the semiconductor chip and which have substantially the same inner diameters;

a resin gluing sealing surfaces of the base and the cap to each other;

a lead frame placed between the sealing surfaces of the base and the cap; and electrical connection means electrically connecting the semiconductor chip to the lead frame, wherein the viscosity of the resin ranges from 2000 to 3500 poise.

In a sixth aspect of this invention, there is provided a semiconductor device comprising:

a semiconductor chip;

a base and a cap enclosing the semiconductor chip and which have substantially the same inner diameters;

a resin gluing sealing surfaces of the base and the cap to each other;

a lead frame placed between the sealing surfaces of the base and the cap; and electrical connection means electrically connecting the semiconductor chip to the lead frame, wherein the fluidity ratio of the resin ranged from 15 to 25.

BRIEF DESCRIPTION OF THE DRAWINGS

FIG. 20A is a front view of a sealing jig to which the base of FIG. 16 to be mounted;

FIG. 20B is a plan view of the sealing jig of FIG. 20A;

FIG. 20C is a side sectional view of the sealing jig of FIG. 20A;

DESCRIPTION OF THE PREFERRED EMBODIMENTS

First Embodiment

Figure 1:
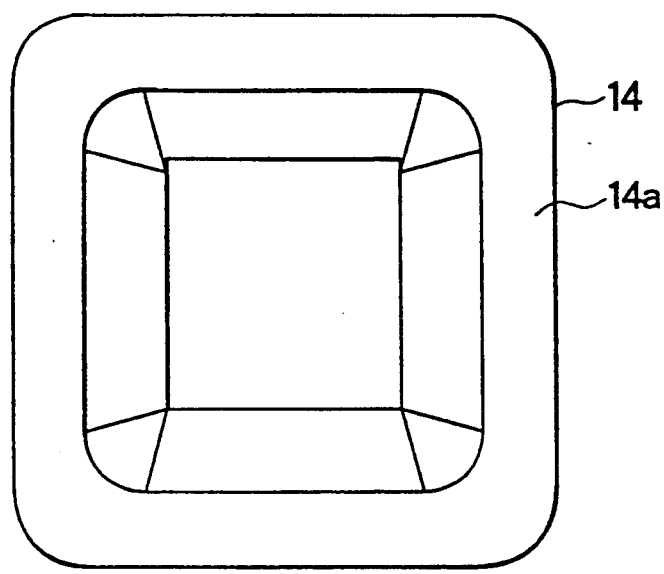
FIG. 1 shows the configuration of the sealing surface of the base of a semiconductor device according to a first embodiment of this invention.
Figure 2:
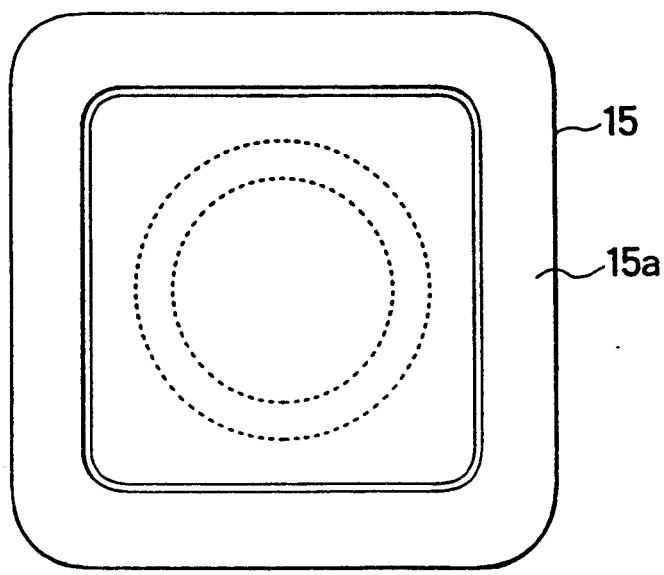
FIG. 2 shows the configuration of the sealing surface of the cap of a semiconductor device according to the first embodiment of this invention.
Figure 3:
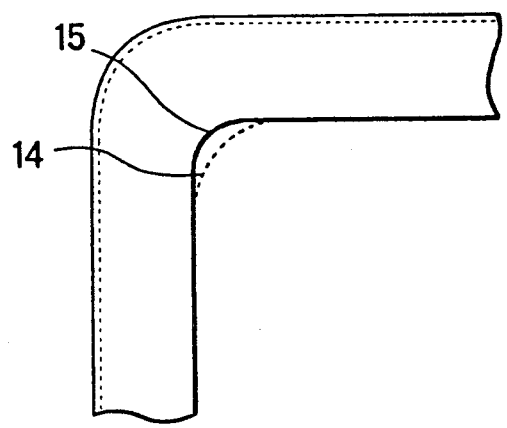
FIG. 3 shows the configuration of each corner of the base and the cap shown in FIGS. 1 and 2.

Embodiments of the present invention will now be described with reference to the drawings. FIGS. 1 and 2 are a plan view and a back side view of the sealing surfaces of the base and the cap, respectively, of a semiconductor device, for example, a pressure sensor, according to the first embodiment of this invention. The dimensions of sealing surfaces 14a and 15a of a base 14 and a cap 15 are determined as shown in FIGS. 1 and 2. A resin 7, for example, a thermosetting resin like an epoxy resin, is applied to the sealing surfaces 14a and 15a, which have dimensions as shown in the drawings, and these two sealing surfaces are joined together. As shown in FIG. 3, in the corner sections, the base 14 has a width approximately 0.2 mm larger than the cap 15, with which it has been joined.

Figure 4:
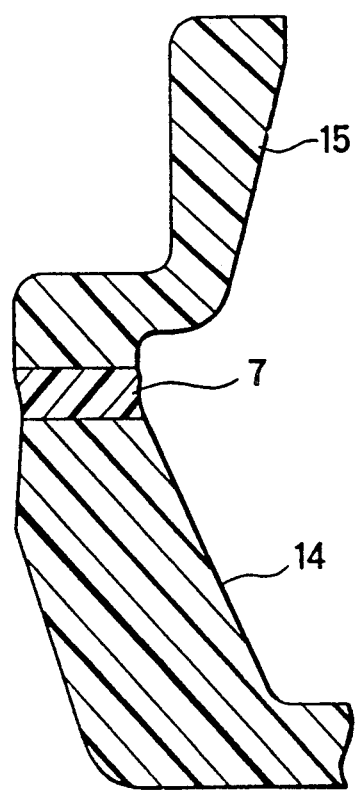
FIG. 4 shows the condition of the resin when the base and the cap shown in FIGS. 1 and 2 are joined to each other.

At the temperature at which the base 14 and the cap 15 are joined together, the applied resin 7 has a very low viscosity, so that it is quite liable to flow. When the base and the cap are joined to each other, the portion of the resin 7 applied to the base 14 and that applied to the cap 15 would concentrate in the corner sections and flow out. However, since the corner sections of the base 14 are wider than those of the cap 15, as shown in FIG. 3, the resin 7 forms a layer having a configuration as shown in FIG. 4, thereby avoiding outflow. Table 1 shows the frequencies of resin outflow in this embodiment as compared to those in a conventional device. As is apparent from the table, this embodiment provides a remarkable outflow-prevention effect.

TABLE 1

|  | Conventional Device |  | First Embodiment |
| --- | --- | --- | --- |
| Corner radius (mm) | Base | 0.5 | 1.5 |
|  | Cap | 0.5 | 1.0 |
| (Outflow occurrences)/(number of tests) immediately before joining | Base | 35/50 | 0/50 |
|  | Cap | 35/50 | 0/50 |
| (Outflow occurrences)/(number of tests) after joining |  | 50/50 | 0/50 |

Second Embodiment

Figure 5:
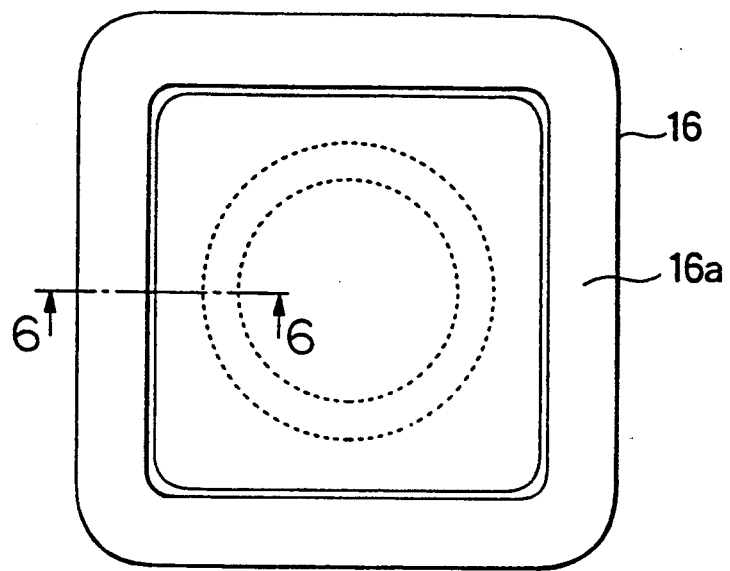
FIG. 5 shows the configuration of the sealing surface of the cap of a semiconductor device according to a second embodiment of this invention.
Figures 6A, 6B:
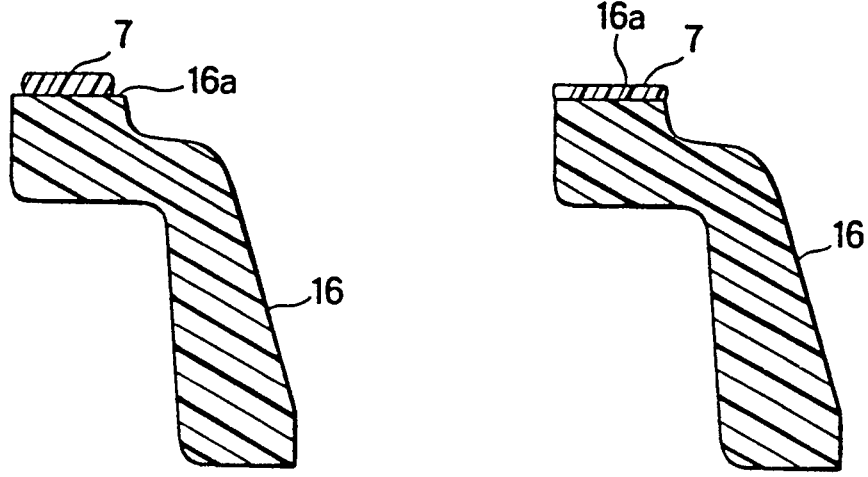
FIG. 6A is a sectional view showing the condition of the applied resin on the sealing surface of the cap shown in FIG. 5 immediately after the application.
FIG. 6B is a sectional view showing the condition of the applied resin two minutes after the application.

FIG. 5 is a back side view showing the configuration of the sealing surface of the cap of a semiconductor device according to the second embodiment of this invention. As shown in the drawing, a cap 16 according to this embodiment differs from the cap 15 of the first embodiment in that it has a sealing surface 16a whose corner sections have an inner diameter of 0.8 mm. FIGS. 6A and 6B show the behavior of the resin 7 applied to the sealing surface 16a, formed as described above. Immediately after the application, the resin has a thickness of approximately 0.3 mm, leaving some portions of the sealing surface 16a uncovered as shown in FIG. 6A. After having been left to stand for approximately two minutes, the resin spreads, as shown in FIG. 6B, over the entire sealing surface 16a, with its thickness having been reduced to approximately 0.2 mm.

In this condition, the cap 16 is attached to the sealing jig 13. Table 2 shows the frequencies of outflow of the resin 7 five minutes after its application and one minute after the attachment of the cap 16 to the sealing jig 13, with the radius of the corner section being varied. It is apparent from the table that a radius of 0.8 mm or more provides a remarkable outflow-prevention effect.

TABLE 2

| Corner radius (mm) | 0.2 | 0.5 | 0.6 | 0.8 | 1.0 | 1.5 |
| --- | --- | --- | --- | --- | --- | --- |
| 5 min. after application (outflow occurrences)/(number of tests) | 25/50 | 0/50 | 0/50 | 0/50 | 0/50 | 0/50 |
| 1 min. after attachment (outflow occurrences)/(number of tests) | 50/50 | 35/50 | 4/50 | 0/50 | 0/50 | 0/50 |

Third Embodiment

Figure 7A:
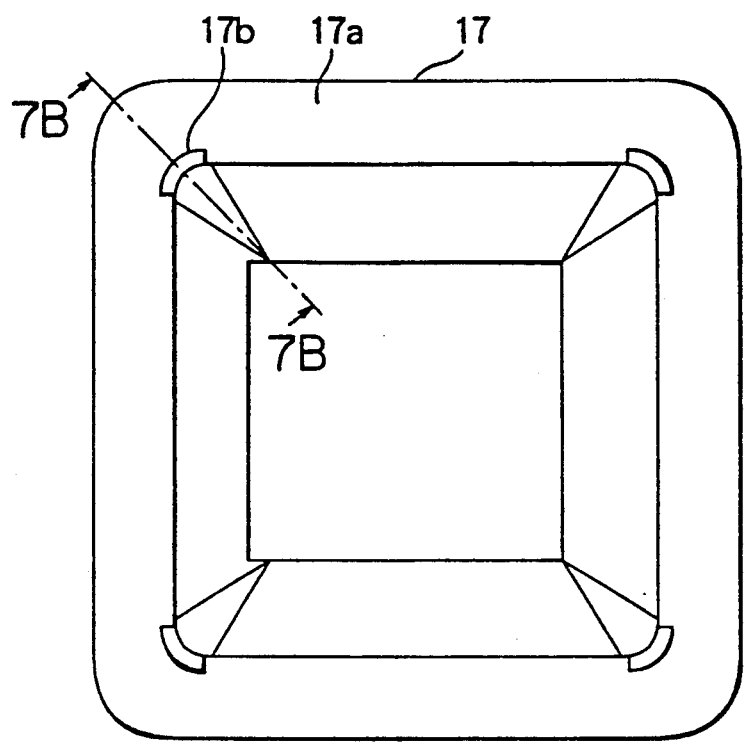
FIG. 7A is a plan view showing the configuration of the sealing surface of the base of a semiconductor device according to a third embodiment of this invention.
Figure 7B:
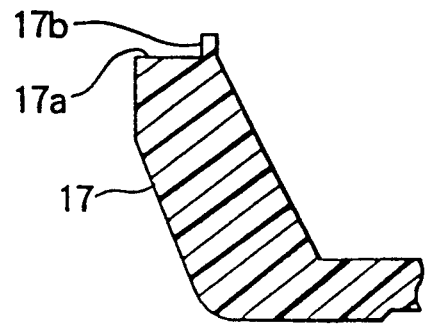
FIG. 7B is a sectional view taken along the line B—B of FIG. 7A.
Figure 8:
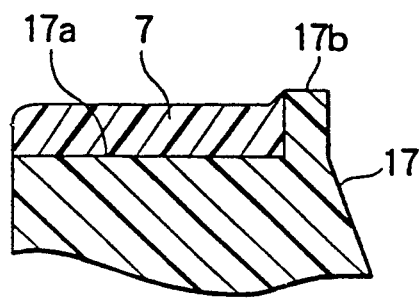
FIG. 8 shows the condition of the applied resin on the sealing surface of the base shown in FIGS. 7A and 7B.
Figure 9:
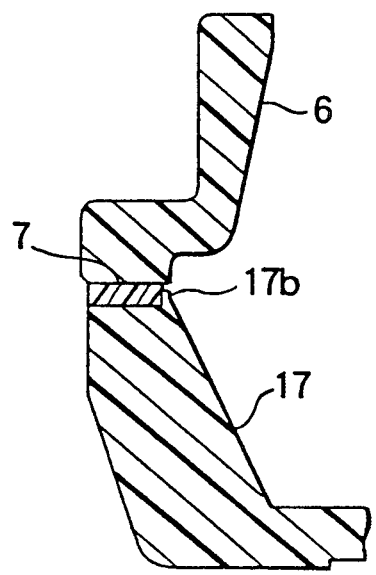
FIG. 9 shows the condition immediately after joining the base of FIGS. 7A and 7B with the cap.

FIGS. 7A and 7B are a plan view and a sectional view showing the configuration of the sealing surface of the base of a semiconductor device according to the third embodiment of this invention. Referring to the drawings, the base 17 has a sealing surface 17a provided with flow stoppers 17b, which extend along the round corner sections to the base. The flow stoppers 17b provide the following advantages: as stated with respect to the second embodiment, the resin 7 has a very low viscosity at the temperature at which the base is joined with the cap, so it spreads over the entire area of the sealing surface 17a when applied thereto. However, the spread of the resin is stopped, as shown in FIG. 8, by the flow stoppers 17b. FIG. 9 shows the condition immediately after the joining of the cap 6 with the base 17. In this condition, the portion of the resin 7 applied to the base 17 and that applied to the cap 6 would concentrate in the corners and flow out. However, the outflow is prevented by the flow stoppers 17b. The gap between the sealing surface 17a of the base 17 and the sealing surface 6a of the cap 6 at this time is set to approximately 0.35 to 0.5 mm.

Fourth Embodiment

Figure 10:
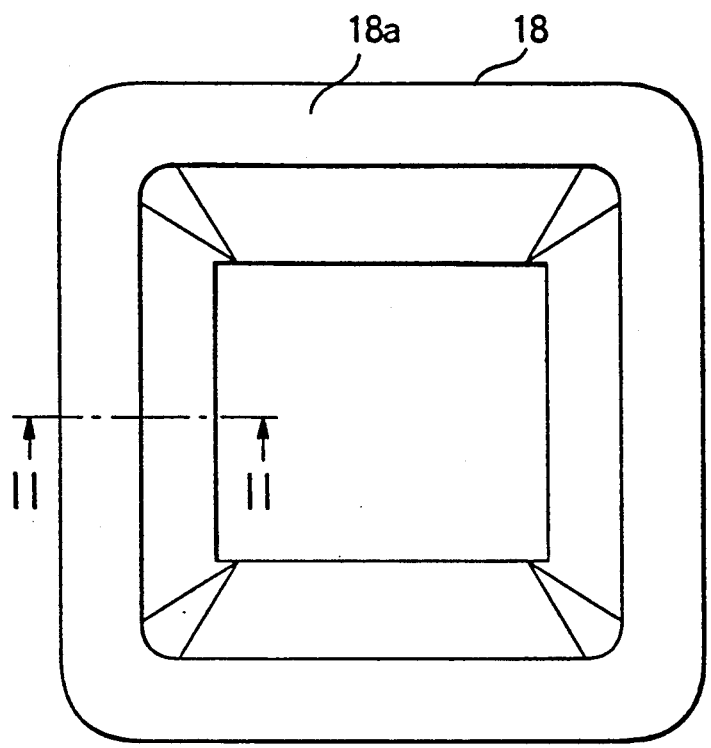
FIG. 10 shows the configuration of the sealing surface of the base of a semiconductor device according to a fourth embodiment of this invention.
Figure 11A:
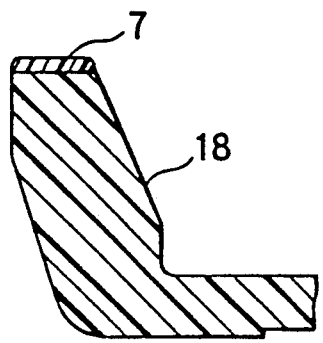
FIGS. 11A and 11B show the condition of the applied resin on the sealing surface of the base of FIG. 10, FIG. 11A showing the condition immediately after the application, and FIG. 11B showing the condition in which resin outflow has occurred as in the conventional device.
Figure 11B:
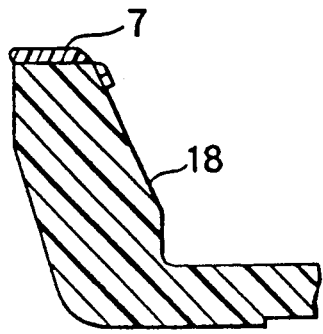

FIG. 10 shows the configuration of the sealing surface of the base of a semiconductor device according to the fourth embodiment of this invention. Referring to the drawing, a base 18 has a sealing surface 18a whose dimension is inwardly 0.4 mm smaller than in the above prior-art device. The resin 7 applied to the sealing surface 18a of the base 18, formed as described above, becomes less viscous when the base is attached to the sealing jig 12. In the condition immediately after the joining of the base 18 with the cap 6, the resin 7, whose fluidity has increased, remains on the sealing surface 18a due to surface tension, as shown in FIG. 11A. When, after that, its viscosity has been further reduced, the resin flow inwardly as shown in FIG. 11B if the sealing surface 18a were formed as in the conventional device. However, since the sealing surfaces (the joint surfaces) of the base 18 and the cap 6 have the same outer diameters, and the sealing surface of the base 18 has an inner dimension which is 0.4 mm smaller than in the prior art, the width of the sealing surface 18a is so much the larger, with the result that the volume of the seal can be increased, thereby enlarging the spreading width of the resin 7, which prevents its flow.

Fifth Embodiment

Figure 12:
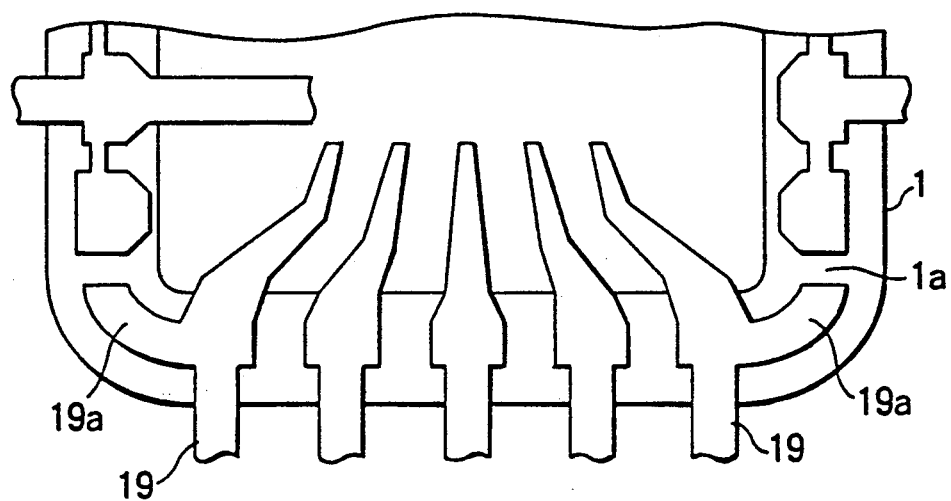
FIG. 12 shows how a lead frame is mounted on the sealing surface of the base of a semiconductor device according to a fifth embodiment of this invention.

FIG. 12 is a diagram showing the sealing surface of the base of a semiconductor device according to the fifth embodiment of this invention, with a lead frame mounted thereon. Referring to the drawing, a lead frame 19 is mounted on the sealing surface 1a of the base 1, with a part 19a of the lead frame extending into each corner section of the sealing surface 1a. As stated with respect to the prior-art device, when the base 1 is attached to the sealing jig 12, the resin 7 applied to the sealing surface 1a of the base 1 has a very low viscosity and, due to the surface tension between the resin and the lead frame 19, the resin would move toward the lead frame 19. However, since the part 19a of the lead frame 19 extends into each corner section, the resin 7 is prevented from moving away from the corner, thereby avoiding a shortage of resin in the corner sections of the sealing surface 1a. In this way, the generation of recesses and holes in the corner sections after the joining of the base 18 with the cap 6 is prevented, thereby providing a better device quality.

Sixth Embodiment

Figure 13A:
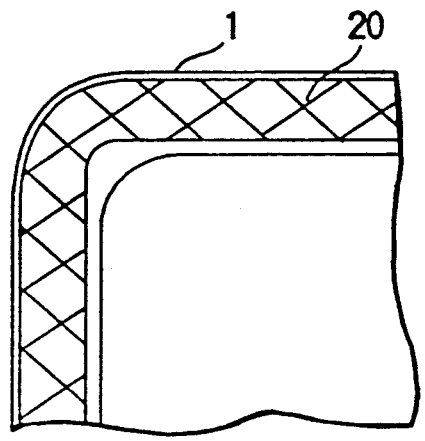
FIGS. 13A and 13B are diagrams showing openings of the resin application masks used when applying resin to the sealing surfaces of a semiconductor device according to a sixth embodiment of this invention, FIG. 13A showing the base side and FIG. 13B the cap side.
Figure 13B:
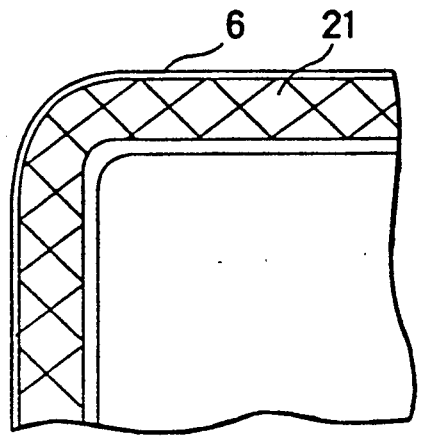

FIGS. 13A and 13B show the openings of resin application masks, for example, net screens, which are used in applying resin to the sealing surfaces of a semiconductor device according to the sixth embodiment of this invention. Referring to the drawings, the opening of a resin application mask 20 has a width smaller than the width of the sealing surface 1a of the base 1. At the same time, the opening has an inner corner radius of 0.5 mm, and the opening of a resin application mask 21 has a width smaller than that of the sealing surface 6a of the cap 6. The inner corner diameter is 0.5 mm. Immediately after its application to the sealing surfaces 1a and 6a of the base 1 and the cap 6 by using the above resin application masks 20 and 21, the resin maintains a configuration and dimensions that are completely the same as those of the resin application masks 20 and 21 shown in FIGS. 13A and 13B.

Two minutes after the application, the resin begins to spread substantially over the entire sealing surfaces 1a and 6a, and when the base 1 and the cap 6 are attached to the sealing jigs 12 and 13, respectively, it would spread still further. However, since the resin application masks 20 and 21 are narrower than the sealing surfaces 1a and 6a, the reduction in thickness and increase in width of the applied resin 7 is stopped before the width of the applied resin 7 has reached the width of the sealing surfaces 1a and 6a, its thickness having been reduced, thereby preventing an outflow of the resin. Table 3 shows the results of an examination of resin outflow and hole generation in the corner sections when the inner corner radii of the resin application masks 20 and 21 are varied.

TABLE 3

|  |  | Prior Art | Comp. Ex. 1 | 6th Emb. | Comp. Ex. 2 | Comp. Ex.3 |
|---|---|---|---|---|---|---|
| Corner radius (mm) | Base | 0.5 | 1.5 | 1.5 | 1.5 | 1.5 |
|  | Cap | 0.5 | 1.0 | 1.0 | 1.0 | 1.0 |
|  | Mask | 0.5 | 0.1 | 0.5 | 1.0 | 1.5 |
| Outflow on jigs (outflow occurrences)/(number of tests) | Base | 30/50 | 0/50 | 0/50 | 0/50 | 7/50 |
|  | Cap | 35/50 | 0/50 | 0/50 | 5/50 | 30/50 |
| Outflow after joining (outflow occurrences)/(number of tests) |  | 50/50 | 0/50 | 0/50 | 5/50 | 35/50 |
| Hole generation in the joint (outflow occurrences)/(number of tests) |  | 15/50 | 45/50 | 0/50 | 1/50 | 21/50 |

It is apparent from these results that when the corner radius is small, the width of the applied resin is small, so that there is a shortage of resin when the resin has been spread over the entire width of the seal, resulting in through-holes in the seal. When, on the other hand, the corner radius is large, resin outflow occurs in the corner sections of the sealing surfaces 1a and 6a, with the result that through-holes are generated in the seal. Thus, while it is apparent from the above embodiments that the dimensions of the base 1 and the cap 6 are of great significance, sufficient consideration must also be given to the dimensions of the resin application masks 20 and 21 in order that recesses and holes in the seal are prevented.

Seventh Embodiment

With a semiconductor device according to the seventh embodiment of this invention, the base and the cap are joined together using a resin whose viscosity at room temperature ranges from 2000 to 3500 poise. Table 4 shows viscosity vs. resin outflow approximately two minutes after application. It can be seen from the table that a viscosity of less than 2000 poise involves an outflow of resin. On the other hand, a viscosity of 3500 poise or more makes it rather difficult for the resin to pass through the resin application masks. Thus, by using a resin whose viscosity at room temperature is in the range of 2000 to 3500 poise, the resin can be applied accurately and an outflow of resin after the application is prevented, thereby enabling the base and the cap to be joined together in a satisfactory manner.

TABLE 4

| Viscosity (poise) | 1500 | 1900 | 2050 | 2970 | 3500 | 3800 |
|---|---|---|---|---|---|---|
| Outflow | some | some | none | none | none | none |
| Passage quality | good | good | good | good | good | poor |

Eighth Embodiment

In a semiconductor device according to the eighth embodiment of this invention, the base and the cap are joined together using a resin whose fluidity ratio ranges from 15 to 25.

The fluidity ratio is a value obtained as follows: 100 mg of a resin is dropped onto a glass plate and left to stand in one atmosphere at the sealing temperature (150° C.). The spreading width and the thickness of the resin in this condition are measured to calculate the value: (spreading width)/(thickness). The value thus obtained is the fluidity ratio.

Figure 14:
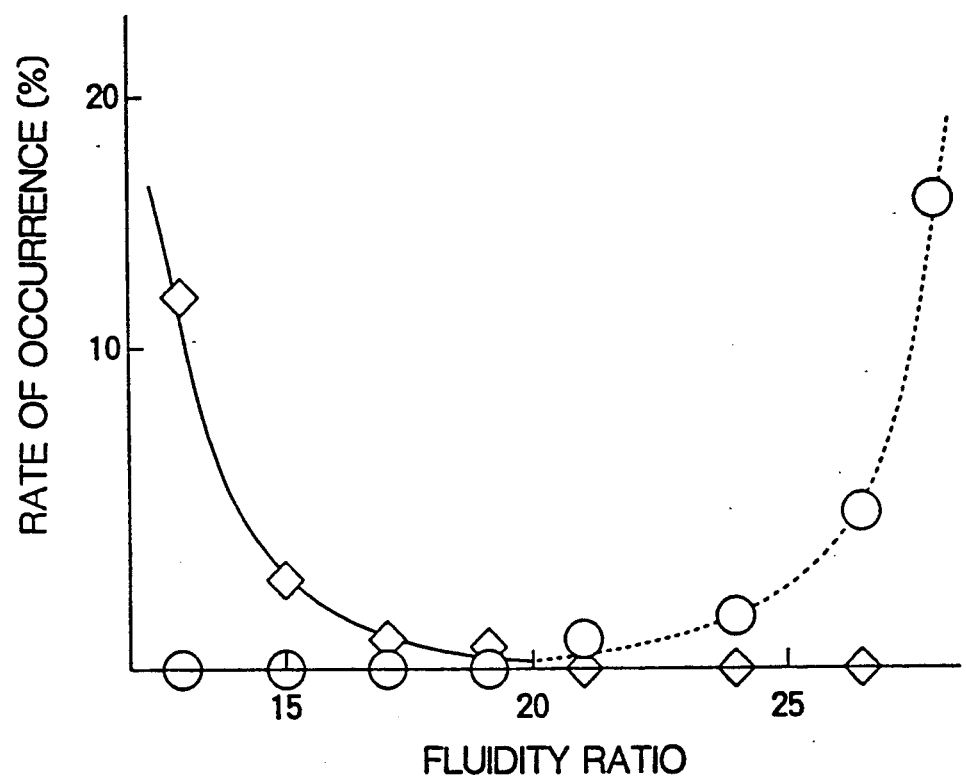
FIG. 14 shows a characteristic curve for illustrating the characteristics of the resin of a semiconductor device according to an eighth embodiment of this invention.
Figure 15:
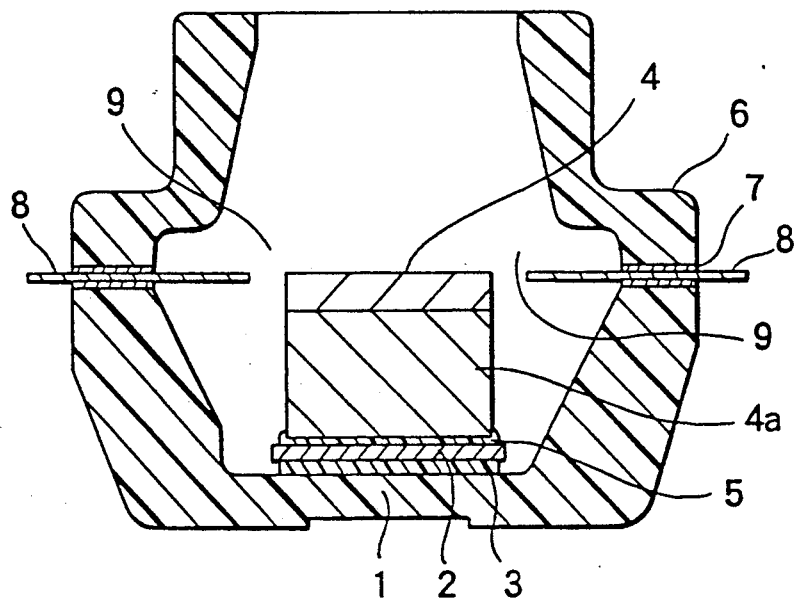
FIG. 15 is a sectional view showing the construction of a conventional resin-seal-type semiconductor device.
Figure 16A:
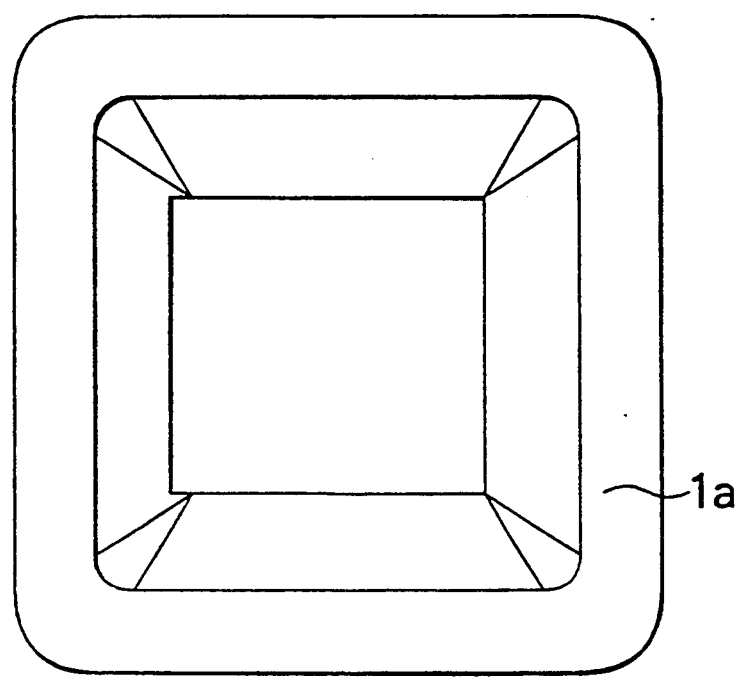
FIG. 16A is a plan view showing the configuration of the base of the semiconductor device shown in FIG. 15.
Figure 16B:
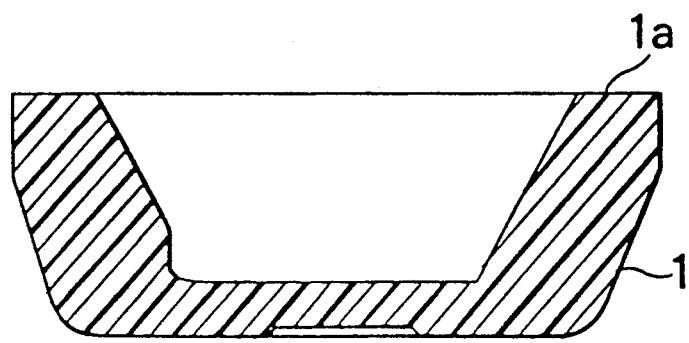
FIG. 16B is a side sectional view of the same.
Figure 17A:
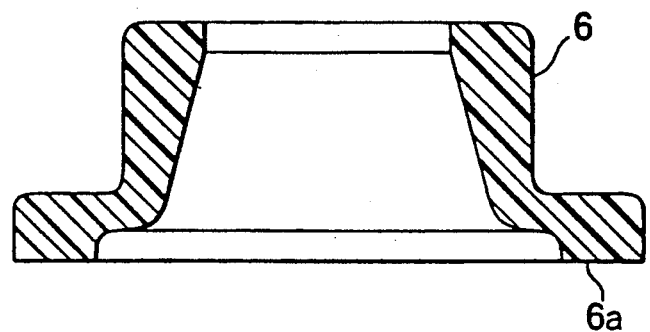
FIG. 17A is a side sectional view showing the configuration of the cap of the semiconductor device shown in FIG. 15.
Figure 17B:
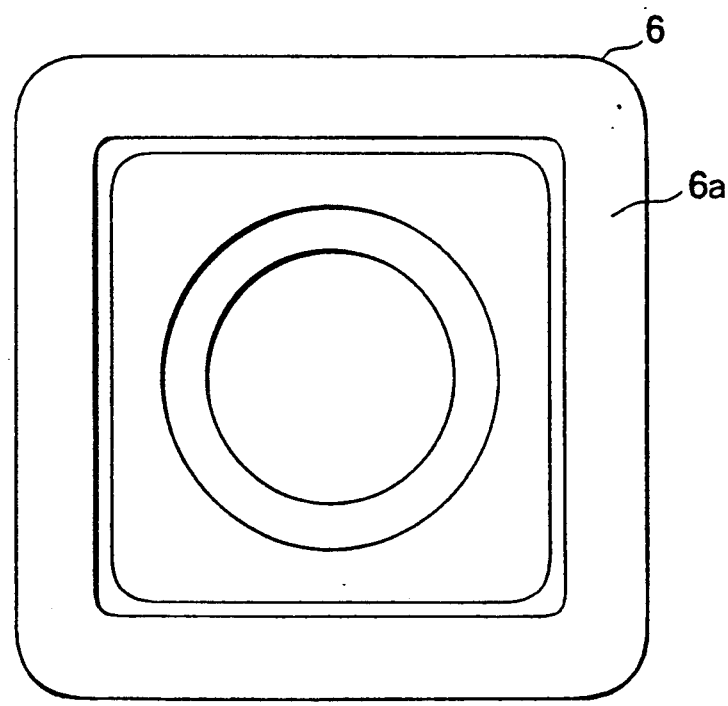
FIG. 17B is a plan view of the same.
Figure 18:
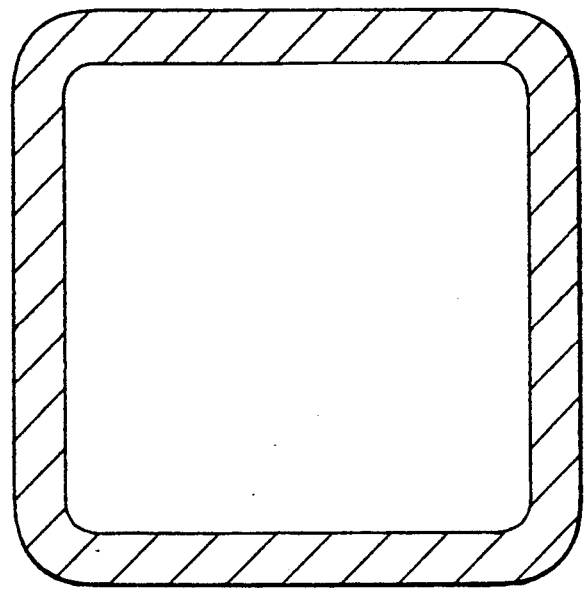
FIG. 18 shows a resin application mask used in applying resin to the base of FIG. 16.
Figure 19:
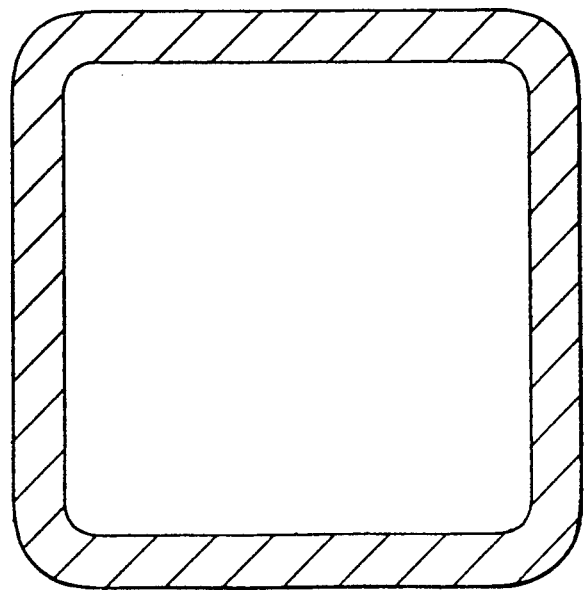
FIG. 19 shows a resin application mask used in applying resin to the cap of FIG. 17.
Figure 21A:
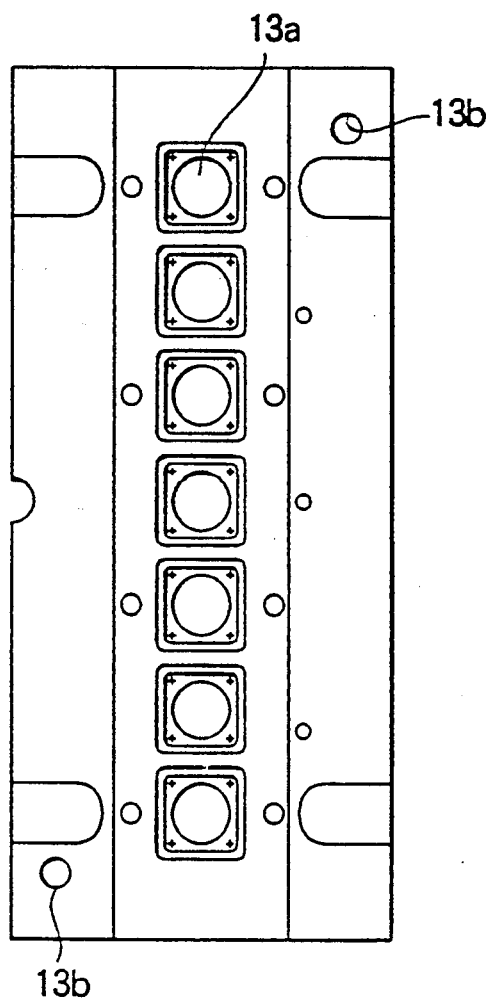
FIG. 21A is a front view of a sealing jig to which the cap of FIG. 17 is to be mounted.
Figure 21B:
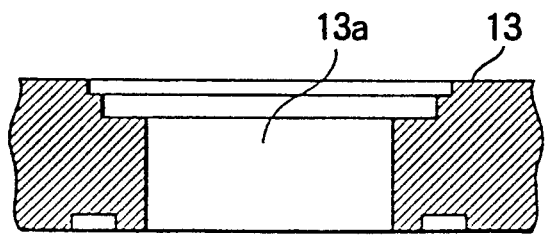
FIG. 21B is a plan view of the sealing jig of FIG. 21A.
Figure 22:
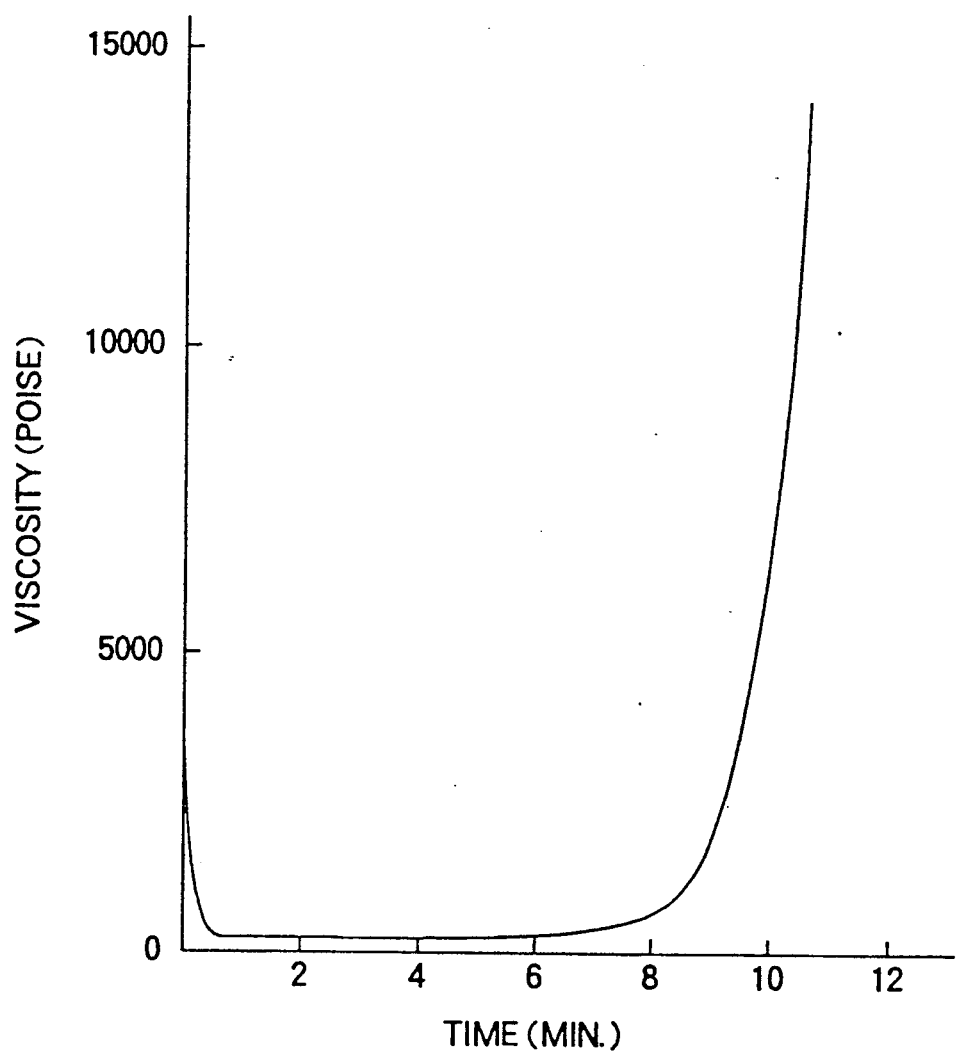
FIG. 22 is a characteristic curve diagram showing the changes with time of the viscosity of the resin applied to the sealing surface.
Figure 23:
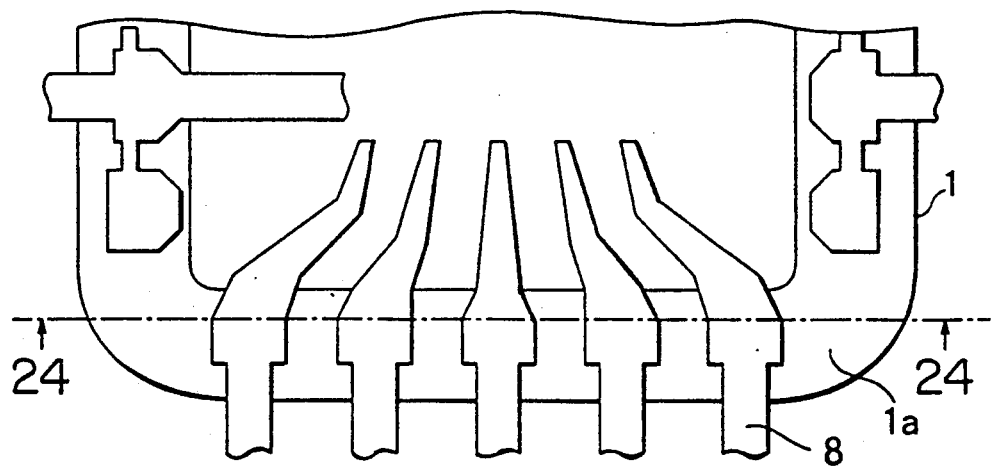
FIG. 23 shows in detail a portion of the semiconductor device of FIG. 15 where leads extend through the seal.
Figure 24:
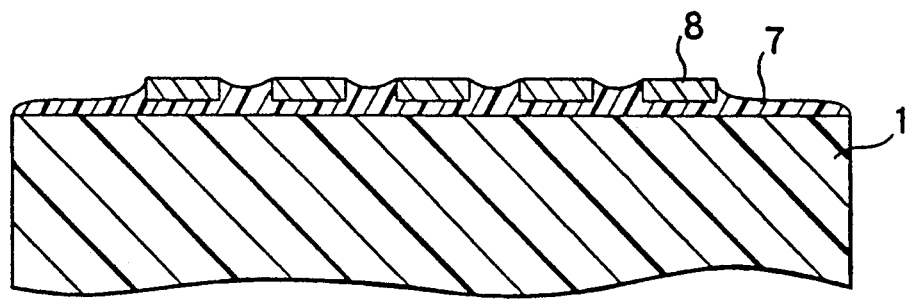
FIG. 24 is a sectional view taken along the line A—A of FIG. 23.

The relationship between the fluidity ratio and the sealing property can be illustrated by a characteristic curve as shown in FIG. 14. In the range where the fluidity ratio is 15 or less, there is a rapid deterioration in fluidity. In this range, there is an increase in the rate of defects (lead exposure), in which the lead frame cannot be perfectly sealed. In the range where the fluidity ratio is 25 or more, there is a rapid increase in fluidity, and resin outflow occurs, resulting in an increase in the rate of occurrence of recesses and holes in the seal.

Thus, by using a resin whose fluidity ratio at the sealing temperature ranges from 15 to 25, it is possible to prevent lead exposure and the generation of recesses and holes.

Thus, in accordance with this invention, the generation of recesses and holes in the resin seal is prevented, thereby making it possible to obtain a high-quality semiconductor device which provides a high production yield.

What is claimed is:

1. A semiconductor device comprising:
a semiconductor chip;
a base and a cap, said base and said cap each having a planar sealing surface with four corners having respective radii and respective inner and outer perimeters and enclosing said semiconductor chip wherein the corner radii of said base are larger than the corner radii of said cap and the inner perimeters of said cap and base are identical except at the corners;
a resin gluing the sealing surface of said base to the sealing surface of said cap;
a lead frame partly disposed between the sealing surfaces of said base and said cap; and
electrical connection means electrically connecting said semiconductor chip to said lead frame wherein the inner perimeter of the sealing surface of said base is smaller than the inner perimeter of the sealing surface of said cap and the outer perimeter of the sealing surface of said base is substantially the same as the outer perimeter of the sealing surface of said cap.

2. A semiconductor device comprising:
a semiconductor chip;
a base and a cap enclosing said semiconductor chip, said base and said cap each having a sealing surface with corners and an inner perimeter wherein the inner perimeters of said base and said cap are substantially the same;
a resin gluing the sealing surface of said base to the sealing surface of said cap;
a lead frame including a plurality of leads partly disposed between the sealing surfaces of the base and the cap; and
electrical connection means electrically connecting said semiconductor chip to said lead frame wherein at least one of said leads of said lead frame adjacent a corner of one of said cap and said base includes a projection transverse to the lead extending around a corner of and disposed on the sealing surfaces of said base and said cap for controlling the flow of resin when gluing said base to said cap.

3. A semiconductor device comprising:
a semiconductor chip;
a base and a cap enclosing said semiconductor chip, said base and said cap each having sealing surfaces;
a resin gluing the sealing surface of said base to the sealing surface of said cap;
a lead frame partly disposed between the sealing surfaces of said base and said cap; and
electrical connection means electrically connecting said semiconductor chip to said lead frame wherein said resin has a viscosity that ranges from 2000 to 3500 poise at room temperature.

4. A semiconductor device comprising:
a semiconductor chip;
a base and a cap enclosing said semiconductor chip, said base and cap each having sealing surfaces;
a resin gluing the sealing surface of said base to the sealing surface of said cap;
a lead frame partly disposed between the sealing surfaces of said base and said cap; and
electrical connection means electrically connecting said semiconductor chip to said lead frame wherein said resin has a fluidity ratio that ranges from 15 to 25.

5. A semiconductor device comprising:
a semiconductor chip;
a base and a cap, said base and said cap each having an inner perimeter and a sealing surface, said base including a plurality of corners in its sealing surface, said base and said cap having the same inner perimeters and enclosing said semiconductor chip;
a resin gluing the sealing surface of said base to the sealing surface of said cap;
a lead frame partly diposed between the sealing surfaces of said base and said cap;
electrical connection means electrically connecting said semiconductor chip to said lead frame; and
means for preventing outflow of resin disposed on an inner surface only at each corner of the sealing surface of said base and comprising a protrusion extending transverse to the sealing surface of said base.

* * * * *

UNITED STATES PATENT AND TRADEMARK OFFICE
CERTIFICATE OF CORRECTION

PATENT NO. : 5,323,058
DATED : June 21, 1994
INVENTOR(S) : Namiki Moriga

It is certified that error appears in the above-indentified patent and that said Letters Patent is hereby corrected as shown below:

On the title page: Item [54] and Column 1, line 2, change "COP" to --CAP--.

Signed and Sealed this

Eighteenth Day of October, 1994

Attest:

BRUCE LEHMAN

Attesting Officer

Commissioner of Patents and Trademarks